(12) United States Patent
Fukuda et al.

(10) Patent No.: US 9,074,284 B2
(45) Date of Patent: Jul. 7, 2015

(54) HEAT TREATMENT APPARATUS

(75) Inventors: Masanao Fukuda, Toyama (JP); Kenji Shirako, Toyama (JP); Akihiro Sato, Toyama (JP); Kazuhiro Morimitsu, Toyama (JP); Sadao Nakashima, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 319 days.

(21) Appl. No.: 12/768,191

(22) Filed: Apr. 27, 2010

(65) Prior Publication Data

US 2010/0275848 A1    Nov. 4, 2010

(30) Foreign Application Priority Data

May 1, 2009    (JP) .................................. 2009-111716
Apr. 13, 2010    (JP) .................................. 2010-091999

(51) Int. Cl.
| | |
|---|---|
| C23C 16/00 | (2006.01) |
| C23F 1/00 | (2006.01) |
| H01L 21/306 | (2006.01) |
| C23C 16/32 | (2006.01) |
| C23C 16/44 | (2006.01) |
| C23C 16/455 | (2006.01) |
| C30B 25/10 | (2006.01) |
| C30B 25/14 | (2006.01) |
| C30B 29/36 | (2006.01) |

(52) U.S. Cl.
CPC ............ *C23C 16/325* (2013.01); *C23C 16/4401* (2013.01); *C23C 16/45574* (2013.01); *C30B 25/10* (2013.01); *C30B 25/14* (2013.01); *C30B 29/36* (2013.01)

(58) Field of Classification Search
CPC .............. C23C 16/325; C23C 16/4401; C23C 16/45574; C30B 29/36; C30B 25/10; C30B 25/14
USPC ........ 118/715, 725, 728; 156/345.37, 345.52; 219/634, 638, 759
See application file for complete search history.

(56) References Cited

U.S. PATENT DOCUMENTS

| | | | | |
|---|---|---|---|---|
| 4,263,872 | A * | 4/1981 | Ban ................................ | 118/721 |
| 4,745,088 | A * | 5/1988 | Inoue et al. ..................... | 117/98 |
| 6,572,371 | B1 * | 6/2003 | Sion et al. ...................... | 118/724 |
| 2003/0118728 | A1 * | 6/2003 | Sion et al. ................... | 427/249.2 |
| 2005/0287806 | A1 * | 12/2005 | Matsuura ....................... | 438/680 |
| 2006/0207504 | A1 * | 9/2006 | Hasebe et al. ................. | 118/715 |
| 2007/0084406 | A1 * | 4/2007 | Yudovsky et al. ............. | 118/724 |
| 2007/0259110 | A1 * | 11/2007 | Mahajani et al. ........... | 427/248.1 |

FOREIGN PATENT DOCUMENTS

| | | |
|---|---|---|
| JP | 03209817 | 9/1991 |
| JP | 09330884 A | 12/1997 |

(Continued)

*Primary Examiner* — Rakesh Dhingra
(74) *Attorney, Agent, or Firm* — Brundidge & Stanger, P.C.

(57) ABSTRACT

Provided is a heat treatment apparatus that can form films having a uniform thickness on a plurality of substrates. The heat treatment apparatus comprises a process chamber configured to grow silicon carbide (SiC) films on wafers, a boat configured to hold a plurality of wafers in a state where the wafers are vertically arranged and approximately horizontally oriented so as to hold the wafers in the process chamber, a heating unit installed in the process chamber, and a gas supply nozzle configured to supply a reaction gas. The heating unit comprises a susceptor configured to cover at least a part of the boat, and a susceptor wall disposed between the boat and the susceptor.

12 Claims, 8 Drawing Sheets

(56) References Cited

FOREIGN PATENT DOCUMENTS

| JP | 11209198 | 8/1999 |
| JP | 2006-196807 | 7/2006 |
| JP | 2007180132 | 7/2007 |
| JP | 2008034780 | 2/2008 |

* cited by examiner

HEAT TREATMENT APPARATUS

CROSS-REFERENCE TO RELATED PATENT APPLICATION

This U.S. non-provisional patent application claims priority under 35 U.S.C. §119 of Japanese Patent Application No. 2009-111716, filed on May 1, 2009, and Japanese Patent Application No. 2010-091999, filed on Apr. 13, 2010, in the Japanese Patent Office, the entire contents of which are hereby incorporated by reference.

BACKGROUND OF THE INVENTION

1. Field of the Invention

The present invention relates to a heat treatment apparatus.

2. Description of the Prior Art

In a conventional silicon carbide (SiC) film forming apparatus, a plurality of substrates are horizontally disposed on a plate-shaped susceptor and are heated to 1500° C. to 1800° C., and a filming forming source gas is supplied to a reaction chamber from a single position.

Patent Document 1 discloses a vacuum film forming apparatus and a thin film forming method, in which a susceptor is disposed in a manner such that a substrate holding surface of the susceptor faces downward so as to solve problems, such as attachment of a deposit caused by a source gas to a surface facing the susceptor, and unstable epitaxial growth caused by a convection flow of a source gas.

[Patent document] Japanese Unexamined Patent Application Publication No. 2006-196807

However, according to the conventional art, since a large plate-shaped susceptor is necessary to process a plurality of substrates, a reaction chamber having a large floor area is necessary.

In addition, since source gas is supplied from a single position, the concentration of the source gas in the reaction chamber is not uniform, and thus the thickness of a film formed on a substrate is not uniform.

SUMMARY OF THE INVENTION

An object of the present invention is to provide a heat treatment apparatus capable of forming films having a uniform thickness on a plurality of substrates.

According to an aspect of the present invention, there is provided a heat treatment apparatus including: a reaction vessel forming a process chamber configured to grow silicon carbide (SiC) epitaxial films on a plurality of SiC substrates; a magnetic field generating unit installed outside the process chamber for electromagnetic induction heating; a substrate holding tool configured to hold the plurality of SiC substrates in a state where the plurality of SiC substrates are vertically arranged and approximately horizontally oriented so as to hold the plurality of SiC substrates in the process chamber; a heating unit installed in the process chamber, the heating unit being heated by the magnetic field generating unit; an inner insulating wall installed between the reaction vessel and the heating unit; a reaction gas supply nozzle installed at an inner side of the heating unit and configured to supply a reaction gas; and a gas exhaust outlet configured to exhaust the reaction gas supplied by the reaction gas supply nozzle, wherein the heating unit includes: a heating part disposed in the process chamber to cover at least a part of the substrate holding tool; and a susceptor wall installed in a region between the heating part and the substrate holding tool other than where the gas supply nozzle and the gas exhaust outlet are disposed.

DETAILED DESCRIPTION OF THE PREFERRED EMBODIMENTS

First Embodiment

Hereinafter, embodiment of the present invention will be described with reference to the attached drawings.

Figure 1:
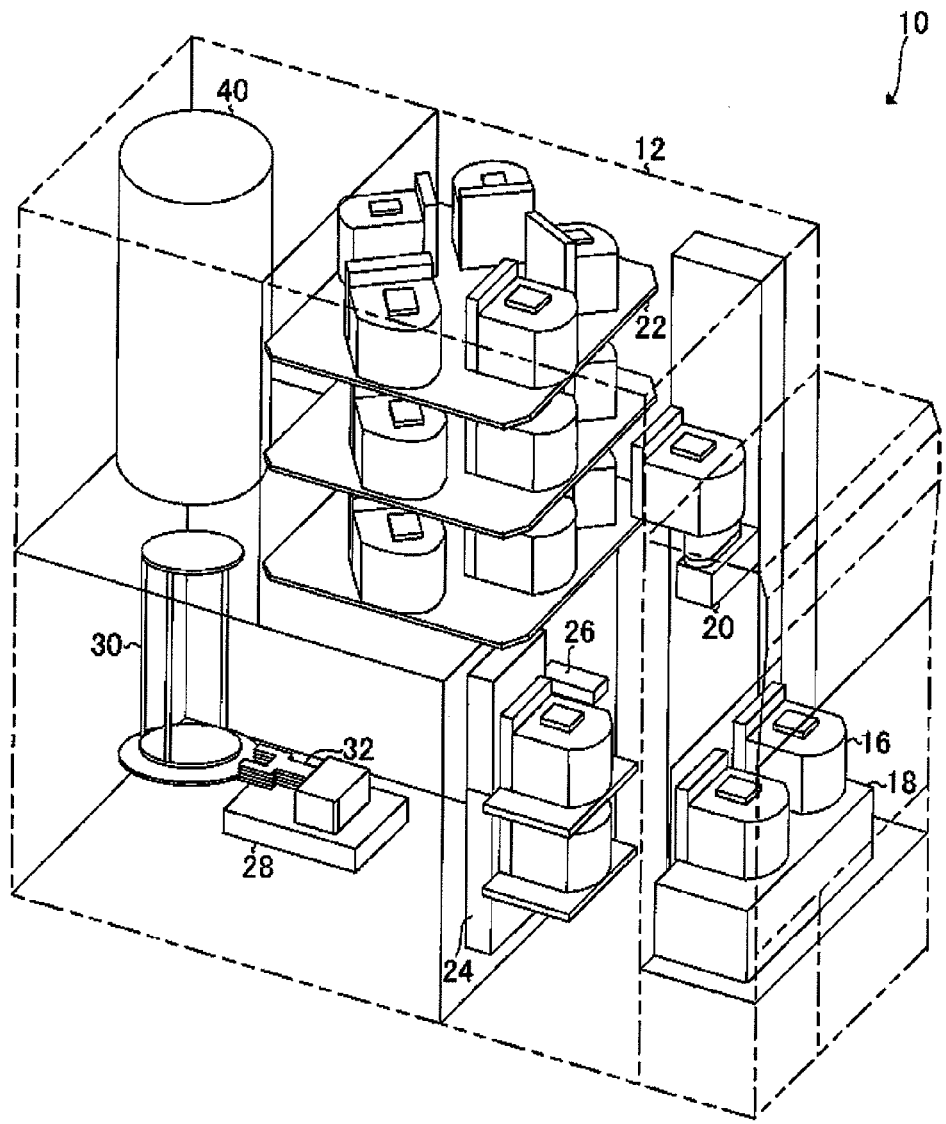
FIG. 1 is a perspective view illustrating a heat treatment apparatus according to an embodiment of the present invention.

FIG. 1 is a perspective view illustrating a heat treatment apparatus 10 according to an embodiment of the present invention. The heat treatment apparatus 10 is a batch type vertical heat treatment apparatus and includes a case 12 in which main parts are disposed. In the heat treatment apparatus 10, FOUPs (front opening unified pods, hereinafter referred to as pods) 16, which are substrate containers configured to accommodate substrates such as wafers 14 made of silicon, are used as wafer carriers. At the front side of the case 12, a pod stage 18 is disposed, and pods 16 are carried to the pod stage 18. For example, twenty five wafers 14 are accommodated in each pod 16, and the pod 16 is set on the pod stage 18 in a state where a cap of the pod 16 is closed.

At a front inner side of the case 12 opposite to the pod stage 18, a pod carrying device 20 is disposed. Furthermore, in the vicinity of the pod carrying device 20, a pod shelf 22, a pod opener 24, and a substrate counter 26 are disposed. The pod shelf 22 is disposed above the pod opener 24 and is configured such that a plurality of pods 16 can be placed and held on the pod shelf 22. The substrate counter 26 is disposed close to the pod opener 24. The pod carrying device 20 carries a pod 16 among the pod stage 18, the pod shelf 22, and the pod opener 24. The pod opener 24 is used to open a cap of a pod 16, and after the cap of the pod 16 is opened, the substrate counter 26 is used to count the number of wafers 14 disposed in the pod 16.

In the case 12, a substrate transfer machine 28, and a boat 30 which is a substrate holding tool are disposed.

The substrate transfer machine 28 includes an arm (tweezers) 32 and is configured to be vertically moved and rotated by a driving unit (not shown). The arm 32 can pick up wafers 14 (for example, five wafers 14), and by operating the arm 32, wafers 14 can be carried between a pod 16 placed at the pod opener 24 and the boat 30.

The boat 30 is made of a heat-resistant material (resistant to 1500° C. to 1800° C.) such as graphite or silicon carbide and is configured to hold a plurality of wafers 14 in a manner such that the wafers 14 are horizontally oriented and vertically arranged in multiple stages with the centers of the wafers 14 being aligned with each other. In addition, at the lower part of the boat 30, a boat insulating part 34 is disposed as a circular disk shaped insulating member made of a heat-resistant material such as graphite or silicon carbide, so as to prevent heat transfer from a susceptor 48 (described later) to the lower side of a process furnace 40 (refer to FIG. 2).

At the rear upper part in the case 12, the process furnace 40 is disposed. In the process furnace 40, the boat 30 charged with a plurality of wafers 14 is loaded, and a heat treatment is performed.

Next, the process furnace 40 will be described.

Figure 2:
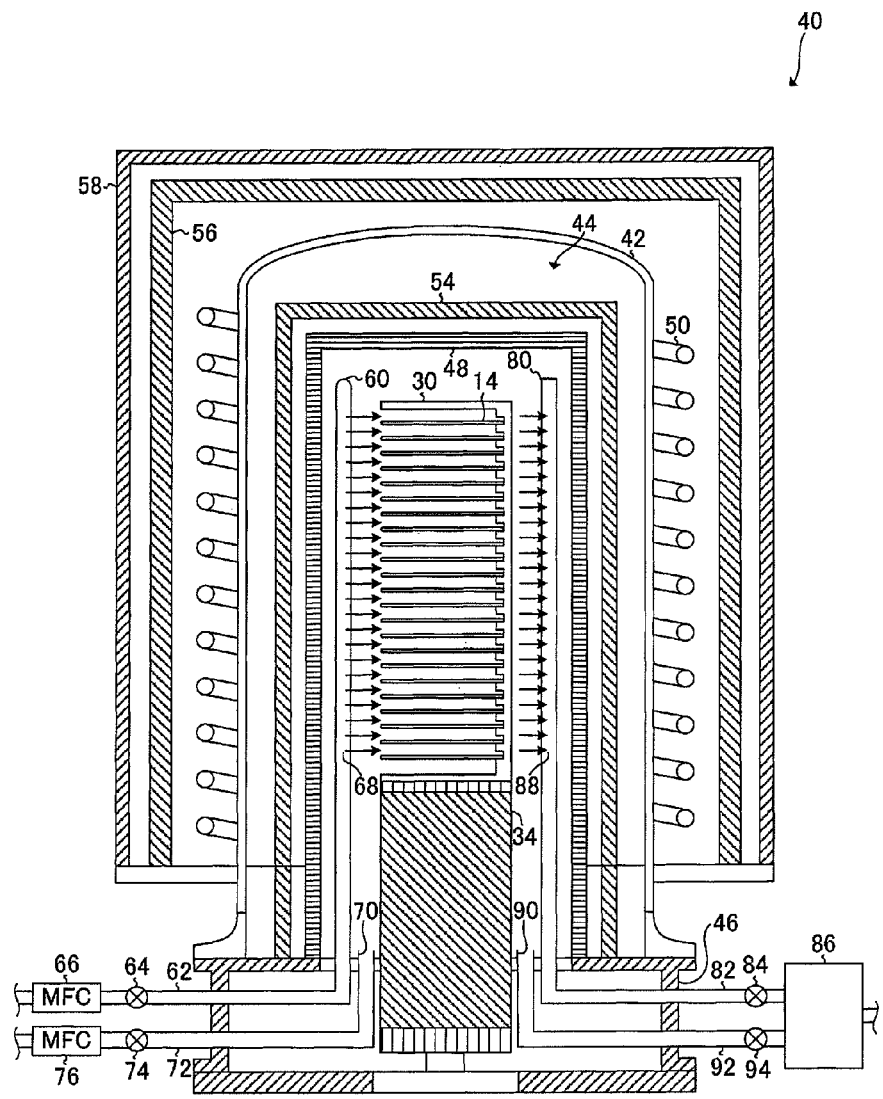
FIG. 2 is a side sectional view illustrating a process furnace used in an embodiment of the present invention.

FIG. 2 is a side sectional view illustrating the process furnace 40. In FIG. 2, a gas supply nozzle 60, a gas supply inlet 70, a gas exhaust nozzle 80, and a gas exhaust outlet 90 are exemplarily illustrated as representative ones.

Figure 3:
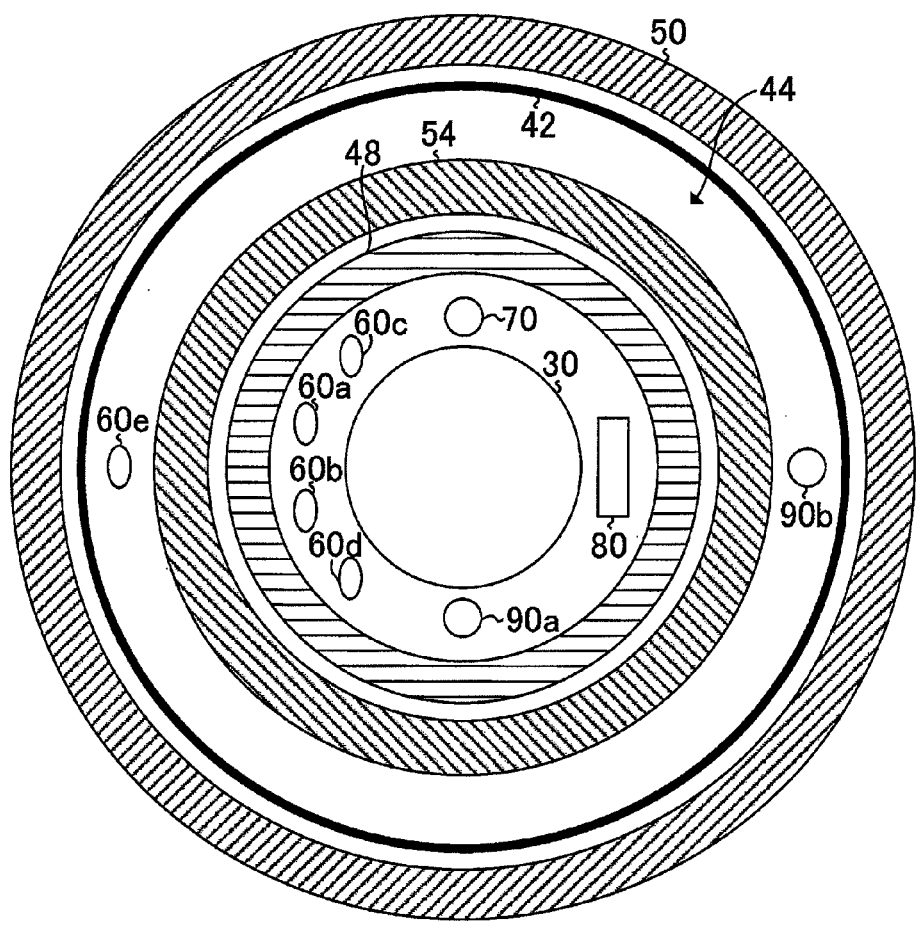
FIG. 3 is a cross-sectional view illustrating the process furnace used in an embodiment of the present invention.

FIG. 3 is a cross-sectional view illustrating the process furnace 40. In the embodiment illustrated in FIG. 3, five gas supply nozzles 60a to 60e, a single gas supply inlet 70, a single gas exhaust nozzle 80, and two gas exhaust outlets 90a and 90b are installed.

The process furnace 40 includes an outer tube 42 as a cylindrical reaction tube. The outer tube 42 is made of a heat-resistant material such as quartz ($SiO_2$) or silicon carbide (SiC) and has a cylindrical shape with a closed top side and an opened bottom side. In the cylindrical hollow part of the inside of the outer tube 42, a process chamber 44 is formed so that wafers 14 can be accommodated in the process chamber 44 in a state where the wafers 14 are horizontally oriented and vertically arranged in multiple stages in the boat 30.

At the lower side of the outer tube 42, a manifold 46 is installed concentrically with the outer tube 42. The manifold 46 is made of a material such as stainless steel and has a cylindrical shape with opened top and bottom sides. The manifold 46 is installed to support the outer tube 42. In addition, between the manifold 46 and the outer tube 42, an O-ring is installed as a seal member. The manifold 46 is supported by a holder (not shown) so that the outer tube 42 can be vertically installed. The outer tube 42 and the manifold 46 constitute a reaction vessel.

The process furnace 40 includes the susceptor 48 as a heating unit made of a material such as graphite, and a magnetic coil 50 as a magnetic field generating unit. The susceptor 48 is disposed in the process chamber 44 and is configured to generate heat in response to a magnetic field generated by the magnetic coil 50 installed outside the outer tube 42. As the susceptor 48 generates heat, the inside of the process chamber 44 is heated.

Near the susceptor 48, a temperature sensor (not shown) is installed as a temperature detector configured to detect the inside temperature of the process chamber 44. The magnetic coil 50 and the temperature sensor are electrically connected to a temperature control unit 52, and the temperature control unit 52 is configured to adjust power supply to the magnetic coil 50 based on temperature information detected by the temperature sensor so as to obtain desired temperature distribution in the process chamber 44 at a desired time (refer to FIG. 5).

Between the susceptor 48 and the outer tube 42, an inner insulating wall 54 made of a material such as felt type carbon is installed to prevent heat transfer from the susceptor 48 to the outer tube 42 or the outside of the outer tube 42. In addition, at the outside of the magnetic coil 50, an outer insulating wall 56 having a structure such as a water cooling structure is installed in a manner such that the outer insulating wall 56 encloses the process chamber 44 so as to prevent heat transfer from the inside of the process chamber 44 to the outside area.

In addition, at the outside of the outer insulating wall 56, an electric field seal 58 is installed to prevent leakage of an electric field generated by the magnetic coil 50 to the outside area.

Gas supply pipes 62 and 72 are inserted through the manifold 46 to supply gases to the gas supply nozzle 60 and the gas supply inlet 70, respectively. For example, the gas supply nozzle 60 has a cylindrical shape. The gas supply pipes 62 and 72 are connected to gas supply sources (not shown) through valves 64 and 74 and gas flow rate control devices such as mass flow controllers (MFCs) 66 and 76, respectively. A gas flow rate control unit 78 is electrically connected to the valves 64 and 74 and the MFCs 66 and 76 so as to control the supply flow rate of gas to a desired level at a desired time (refer to FIG. 5).

Supply holes 68 are formed in the gas supply nozzle 60 to supply gas to each wafer held by the boat 30. For example, as many supply holes 68 as the number of wafers may be formed.

In addition, gas exhaust pipes 82 and 92 to which the gas exhaust nozzle 80 and the gas exhaust outlet 90 are respectively connected are inserted through the manifold 46. For example, the gas exhaust nozzle 80 has a cylindrical shape. A vacuum exhaust device 86 such as a vacuum pump is connected to the downstream sides of the gas exhaust pipes 82 and 92 through pressure detectors (not shown) such as pressure sensors and pressure regulators such as automatic pressure controller (APC) valves 84 and 94. The pressure sensors and the APC valves 84 and 94 are electrically connected to a pressure control unit 98, and the pressure control unit 98 is configured to adjust the opening degrees of the APC valves 84 and 94 based on pressures detected by the pressure sensors for controlling the pressure inside the process chamber 44 to a desired level at a desired time (refer to FIG. 5).

Exhaust holes 88 are formed in the gas exhaust nozzle 80 to exhaust gas from each wafer held on the boat 30. For example, as many exhaust holes 88 as the number of wafers may be formed.

The lower parts of the gas supply nozzle 60 and the gas exhaust nozzle 80 are made of quartz. In this case, heat (for example, 1500° C. to 1700° C.) generated during a film forming process can be effectively prevented from transferring to the manifold 46 as compared with other cases of not using quartz.

The heat conductivity of quartz (1 to 2 W/m·° C.) is lower than, for example, the heat conductivity of carbon (100 to 200 W/m·° C.). That is, quartz is a good insulator.

In addition, quartz has good workability (for welding, bonding, etc.) and sealing performance as compared with a material such as carbon. Therefore, if the lower parts of the gas supply nozzle 60 and the gas exhaust nozzle 80 are made of quartz, the gas supply nozzle 60 and the gas exhaust nozzle 80 may be easily formed in, for example, an L-shape, and be coupled with other parts such as the manifold 46 with good sealing performance.

Therefore, it is preferable that appropriate lower parts of the gas supply nozzle 60 and the gas exhaust nozzle 80 be made of quartz in consideration of the above-described effects: a heat blocking effect during a film forming process, and workability and sealing performance improving effects.

Owing to this structure, gas ejected through the supply holes 68 flows toward the exhaust holes 88. Therefore, the gas flow can be parallel with wafers 14, and the entire areas of the wafers 14 can be efficiently and uniformly exposed to the gas.

The gas supply nozzle 60, the gas supply inlet 70, the gas exhaust nozzle 80, and the gas exhaust outlet 90 will now be described in more detail.

Referring to FIG. 3, four gas supply nozzles 60*a*, 60*b*, 60*c*, and 60*d* are disposed in the susceptor 48, and a gas supply nozzle 60*e* is disposed between the outer tube 42 and the inner insulating wall 54.

As a silicon source, a gas mixture of hydrogen and silicon chloride hydride such as trichlorosilane is introduced through the gas supply nozzles 60*a* and 60*b*. As a carbon source, a gas mixture of hydrogen and carbon hydride such as propane is introduced through the gas supply nozzle 60*c*. As a dopant gas for forming an n-type doped layer, nitrogen is introduced through the gas supply nozzle 60*d*. Alternatively, a material such as a boron or aluminum compound may be used as a dopant gas for forming a p-type doped layer. Gases introduced through the gas supply nozzles 60*a* to 60*d* are not limited to the above-described mentioned gases. That is, other proper gases may also be used according to purposes. Silicon hydride, silicon chloride, silicon chloride hydride, or any one thereof diluted with hydrogen or argon may be used as a silicon source. Hereinafter, such gases used for processing (forming films on) wafers 14 disposed in the process chamber 44 will be referred to as reaction gases.

In the case where the gas supply nozzle 60 (in the example, the gas supply nozzles 60*a* and 60*b*) configured to supply a silicon source gas and the gas supply nozzle 60 (in the example, the gas supply nozzle 60*c*) configured to supply a carbon source gas are separately and independently installed, delays of gas supplies can be effectively prevented as compared with other cases.

In detail, by supplying a silicon source gas and a carbon source gas through the separate gas supply nozzles 60, reaction between the gases inside the gas supply nozzles 60 can be prevented. However, if the silicon source gas and the carbon source gas are supplied through the same gas supply nozzle 60, the gases may react with each other in the gas supply nozzle 60, and thus the supply holes 68 may be clogged or SiC may be deposited on the inside of the gas supply nozzle 60.

Between the outer tube 42 and the inner insulating wall 54, the gas supply nozzle 60*e* is disposed to introduce inert gas such as argon gas. The gas supply nozzle 60*e* is provided to prevent permeation of a reaction gas between the outer tube 42 and the inner insulating wall 54, and thus to prevent unnecessary attachment of a product to the inner wall of the outer tube 42.

In addition, the gas supply inlet 70 is disposed in the susceptor 48. A carrier dopant gas such as trimethylaluminium (TMA), diborane ($B_2H_6$), or boron trichloride ($BCl_3$) is introduced through the gas supply inlet 70.

Furthermore, in the susceptor 48, the gas exhaust nozzle 80 is disposed at a side opposite to the gas supply nozzles 60*a* to 60*d*, and the gas exhaust outlet 90*a* is disposed at a side opposite to the gas supply inlet 70. The gas exhaust nozzle 80 and the gas exhaust outlet 90*a* are configured to exhaust reaction gases mainly.

Between the outer tube 42 and the inner insulating wall 54, the gas exhaust outlet 90*b* is disposed at a side opposite to the gas supply nozzle 60*e*. The gas exhaust outlet 90*b* is configured to mainly exhaust gas, which is introduced through the gas supply nozzle 60*e* to perform an inter gas purge process on an insulating material region (between the outer tube 42 and the inner insulating wall 54).

In the above-described structure of the process furnace 40, gases are introduced into the process chamber 44 from the gas supply nozzles 60*a* to 60*e* and the gas supply inlet 70 as follows: gases are supplied from gas supply sources (not shown) to corresponding gas supply pipes 62*a* to 62*e* and 72, and after the flow rates of the gases are adjusted at MFCs 66*a* to 66*e* and 76, the gases are introduced into the process chamber 44 through valves 64*a* to 64*e* and 74.

Then, the gases introduced into the process chamber 44 are exhausted from the process chamber 44 by the vacuum exhaust device 86 connected to gas exhaust pipes 82, 92*a*, and 92*b* corresponding to the gas exhaust nozzle 80 and the gas exhaust outlets 90*a* and 90*b*.

Next, the surrounding structures of the process furnace 40 will be described.

Figure 4:
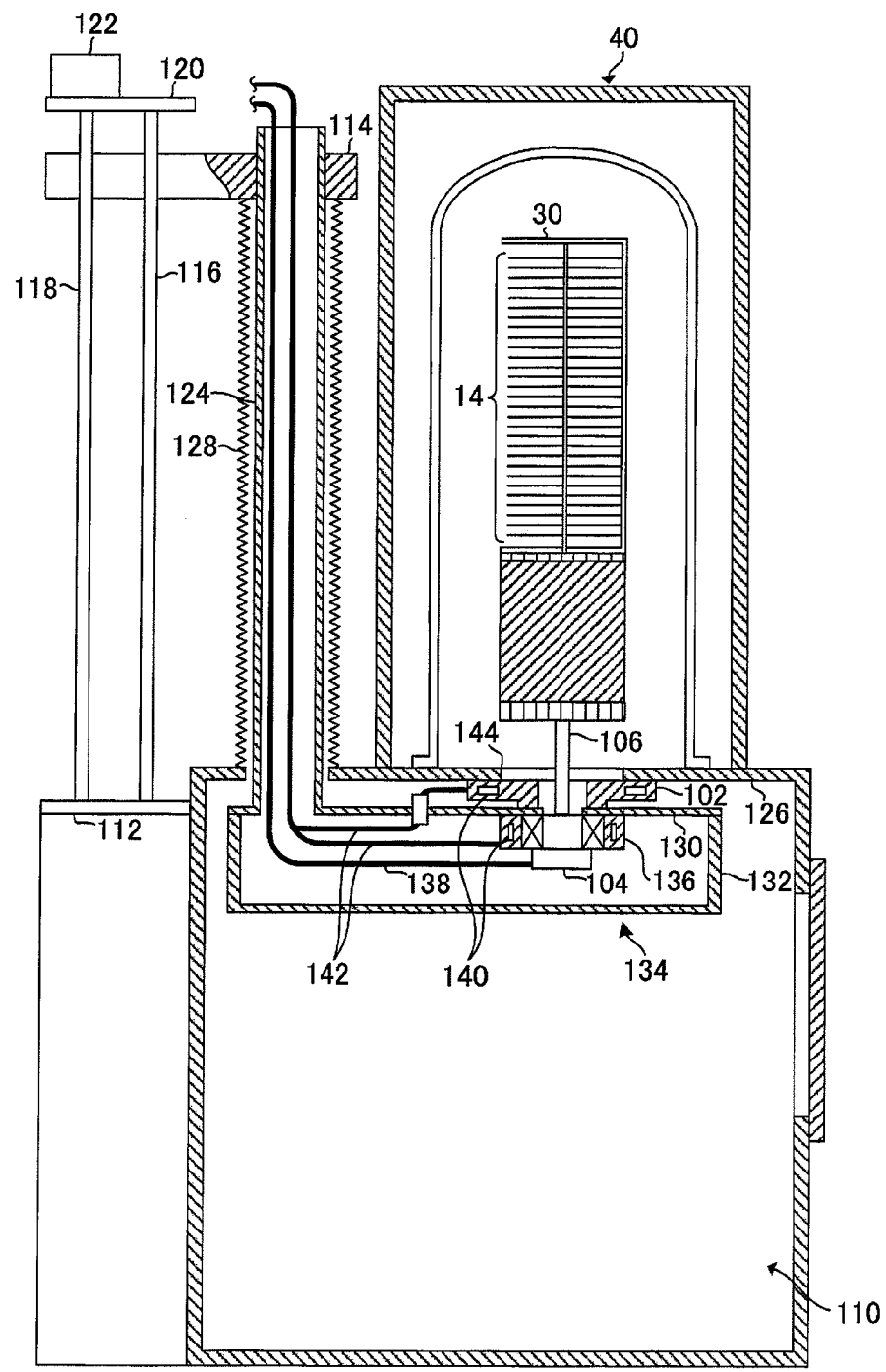
FIG. 4 is a schematic view illustrating the process furnace and the surrounding structures of the process furnace used in an embodiment of the present invention.

FIG. 4 is a schematic view illustrating the process furnace 40 and the surrounding structures of the process furnace 40. At the bottom side of the process furnace 40, a seal cap 102 is installed as a furnace port cover to hermetically close the bottom-side opening of the process furnace 40. The seal cap 102 is made of a material such as stainless steel and has a circular disk shape. On the top surface of the seal cap 102, an O-ring is installed as a seal member configured to make contact with the bottom side of the process furnace 40. At the seal cap 102, a rotary mechanism 104 is installed. A rotation shaft 106 of the rotary mechanism 104 is connected to the boat 30 through the seal cap 102 and is configured to rotate wafers 14 by rotating the boat 30. The seal cap 102 is configured to be vertically lifted and lowered by an elevating motor 122 (described later) installed at the outside of the process furnace 40 as an elevating mechanism, so as to load the boat 30 into the process furnace 40 and unload the boat 30 from the process furnace 40. The rotary mechanism 104 and the elevating motor 122 are electrically connected to a driving control unit 108, and thus desired operations can be performed at desired times under the control of the driving control unit 108 (refer to FIG. 5).

At the outer surface of a loadlock chamber 110 which is a preliminary chamber, a lower base plate 112. A guide shaft 116 fitted in an elevating table 114, and a ball screw 118 screw-coupled with the elevating table 114 are installed at the lower base plate 112. On the upper ends of the guide shaft 116 and the ball screw 118 erected on the lower base plate 112, an upper base plate 120 is installed. The ball screw 118 is rotated by the elevating motor 122 installed on the upper base plate 120. As the ball screw 118 is rotated, the elevating table 114 is lifted or lowered.

At the elevating table 114, a hollow elevating shaft 124 is installed to be extended from the elevating table 114, and a joint part between the elevating table 114 and the elevating shaft 124 is hermetically kept. The elevating shaft 124 and the elevating table 114 are configured to be lifted and lower together with each other. The elevating shaft 124 is movably inserted through a top plate 126 of the loadlock chamber 110. A penetration hole of the top plate 126 through which the elevating shaft 124 is movably inserted is sufficiently large so that the elevating shaft 124 does not make contact with the top plate 126 at the penetration hole. Between the loadlock chamber 110 and the elevating table 114, a bellows 128 is installed as a hollow flexible part configured to enclose the elevating shaft 124, so that the loadlock chamber 110 can be hermetically kept. The bellows 128 can be sufficiently expanded and contracted in accordance with lifting motions of the elevating table 114, and the bellows 128 has an inner diameter sufficiently greater than the outer diameter of the elevating shaft 124 so as not to make contact with the elevating shaft 124 during expansion or contraction.

An elevating base plate 130 is fixed to the lower end of the elevating shaft 124. A driving unit cover 132 is hermetically attached to the bottom surface of the elevating base plate 130 with a seal member such as an O-ring being disposed therebetween. The elevating base plate 130 and the driving unit cover 132 constitute a driving unit accommodation case 134. In this way, the inside of the driving unit accommodation case 134 is isolated from the inside atmosphere of the loadlock chamber 110.

In addition, the rotary mechanism 104 for the boat 30 is installed in the driving unit accommodation case 134, and the periphery of the rotary mechanism 104 is cooled by a cooling mechanism 136.

A power supply cable 138 extends from the upper end of the elevating shaft 124 to the rotary mechanism 104 through the hollow part of the elevating shaft 124, and then the power supply cable 138 is connected to the rotary mechanism 104. In addition, cooling channels 140 are formed in the cooling mechanism 136 and the seal cap 102. Coolant conduits 142 extend from the upper end of the elevating shaft 124 to the cooling channels 140 through the hollow part of the elevating shaft 124, and then the coolant conduits 142 are connected to the cooling channels 140.

By rotating the ball screw 118 using the elevating motor 122, the driving unit accommodation case 134 can be lifted or lowered through the elevating table 114 and the elevating shaft 124.

If the driving unit accommodation case 134 is lifted, a furnace port 144 which is an opening of the process furnace 40 is closed by the seal cap 102 hermetically installed at the elevating base plate 130, and thus it becomes a wafer processible state. If the driving unit accommodation case 134 is lowered, the boat 30 is also lowered together with the seal cap 102, and in this state, wafers 14 can be carried to an outside area.

Figure 5:
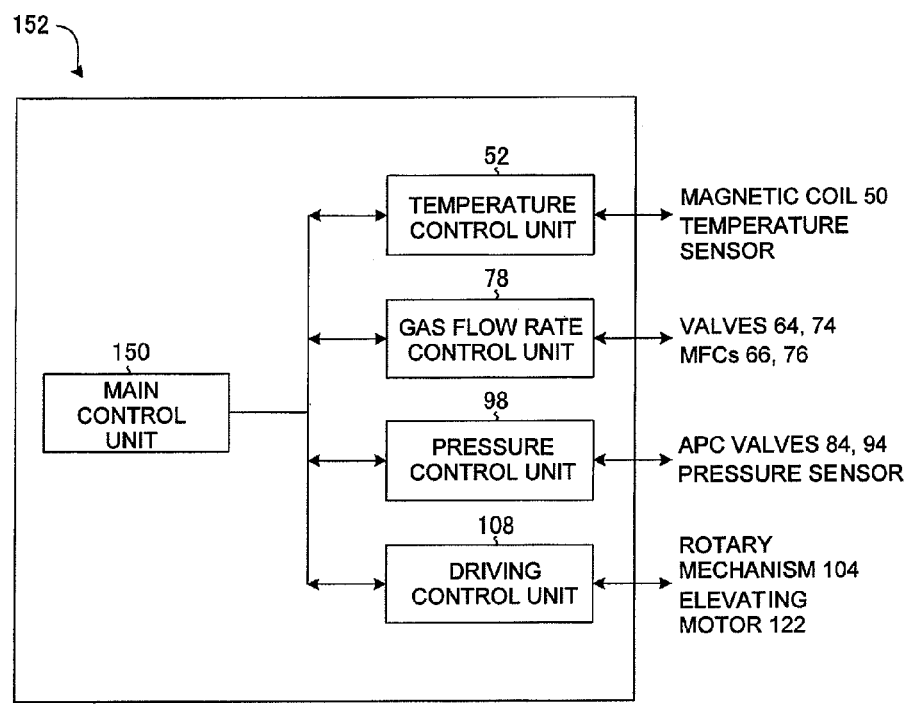
FIG. 5 is a block diagram illustrating a controller of the heat treatment apparatus according to an embodiment of the present invention.

FIG. 5 illustrates a configuration for controlling each part of the heat treatment apparatus 10.

The temperature control unit 52, the gas flow rate control unit 78, the pressure control unit 98, and the driving control unit 108 constitute a manipulation unit and an input/output unit and are electrically connected to a main control unit 150 that controls the overall operation of the heat treatment apparatus 10. The temperature control unit 52, the gas flow rate control unit 78, the pressure control unit 98, and the driving control unit 108 are configured as a controller 152.

Next, an explanation will be given on a method of forming a film such as SiC film on a substrate such as a SiC wafer by using the above-described heat treatment apparatus 10 in one of semiconductor device manufacturing processes. In the following explanation, each part of the heat treatment apparatus 10 is controlled by the controller 152.

First, if a pod 16 accommodating a plurality of wafers 14 is set on the pod stage 18, the pod carrying device 20 carries the pod 16 from the pod stage 18 to the pod shelf 22 so that the pod shelf 22 is stocked with the pod 16. Next, the pod carrying device 20 carries the pod 16 from the pod shelf 22 to the pod opener 24 and set the pod 16 on the pod opener 24; the pod opener 24 opens a cap of the pod 16; and the substrate counter 26 detects the number of the wafers 14 accommodated in the pod 16.

Next, the substrate transfer machine 28 picks up wafers 14 from the pod 16 placed on the pod opener 24 and transfers the wafers 14 to the boat 30.

After a plurality of wafers 14 are charged into the boat 30, the boat 30 charged with the wafers 14 is loaded into the process chamber 44 (boat loading) as the elevating table 114 and the elevating shaft 124 are lifted by the elevating motor 122. At this time, the bottom side of the manifold 46 is sealed by the seal cap 102 in a state where the O-ring being disposed between the manifold 46 and the seal cap 102.

The inside of the process chamber 44 is vacuum-evacuated by the vacuum exhaust device 86 to a predetermined pressure (vacuum degree). At this time, the inside pressure of the process chamber 44 is measured using a pressure sensor, and based on the measured pressure, the APC valves 84, 94a, and 94b corresponding to the gas exhaust nozzle 80 and the gas exhaust outlets 94a and 94b are feedback-controlled. In addition, the inside of the process chamber 44 is heated by the susceptor 48 to a predetermined temperature. At this time, to obtain desired temperature distribution in the process chamber 44, power to the magnetic coil 50 is feedback-controlled based on temperature information detected by a temperature sensor. Subsequently, the rotary mechanism 104 rotates the boat 30 to rotate the wafers 14 charged in the boat 30.

Subsequently, reaction gases are supplied to the gas supply nozzles 60a to 60d from gas supply sources (not shown), respectively. To keep the flow rates of the gases at desired levels, after controlling the opened degrees of the MFCs 66a to 66d corresponding to the gas supply nozzles 60a to 60d, the valves 64a to 64d are opened. Then, the respective reaction gases flow through the gas supply pipes 62a to 62d and are introduced into the process chamber 44 through supply holes 68a to 68d. In addition, after controlling the opened degree of the MFC 76, the valve 74 is opened. Then, gas flows through the gas supply pipe 72 and is introduced into the process chamber 44 through the gas supply inlet 70. The gases introduced through the gas supply nozzles 60a to 60d and the gas supply inlet 70 are allowed to flow through the inside of the susceptor 48 disposed in the process chamber 44 and are exhausted mainly from the gas exhaust nozzle 80 and the gas exhaust outlet 90a through the gas exhaust pipes 82 and 92a. When the reaction gases flow through the inside of the process chamber 44, the reaction gases make contact with the wafers 14 so that SiC films can be deposited on the surfaces of the wafers 14.

In addition, gas is supplied to the gas supply nozzle 60e from a gas supply source (not shown). To keep the flow rate of the gas at a desired level, after controlling the opened degree of the MFC 66e corresponding to the gas supply nozzle 60e, the valve 64e is opened. Then, the gas flows through the gas supply pipe 62e and is introduced into the process chamber 44 through supply holes 68e. The gas introduced through the gas supply nozzle 60e flows between the inside of the process chamber 44 and the outside of the inner insulating wall 54 and is mainly exhausted from gas exhaust outlet 90b.

After a predetermined time, inert gas is supplied from an inert gas supply source (not shown) to replace the inside atmosphere of the process chamber 44 with the inert gas, and along with this, the inside pressure of the process chamber 44 is returned to normal pressure.

Thereafter, the seal cap 102 is lowered by the elevating motor 122 to open the bottom side of the manifold 46, and along with this, the processes wafers 14 are unloaded from the outer tube 42 through the bottom side of the manifold 46 in a state where the processed wafers 14 are held in the boat 30 (boat unloading), and the boat 30 is left at a predetermined position until all the wafers 14 held in the boat 30 are cooled. Next, if the wafers 14 of the boat 30 are cooled to a predetermined temperature, the substrate transfer machine 28 picks up the wafers 14 from the boat 30 and carries the wafers 14 into an empty pod 16 set on the pod opener 24. Thereafter, the pod carrying device 20 carries the pod 16 in which the wafers 14 are accommodated to the pod shelf 22 or the pod stage 18. In this way, a series of operations of the heat treatment apparatus 10 is completed.

Second Embodiment

Figure 6:
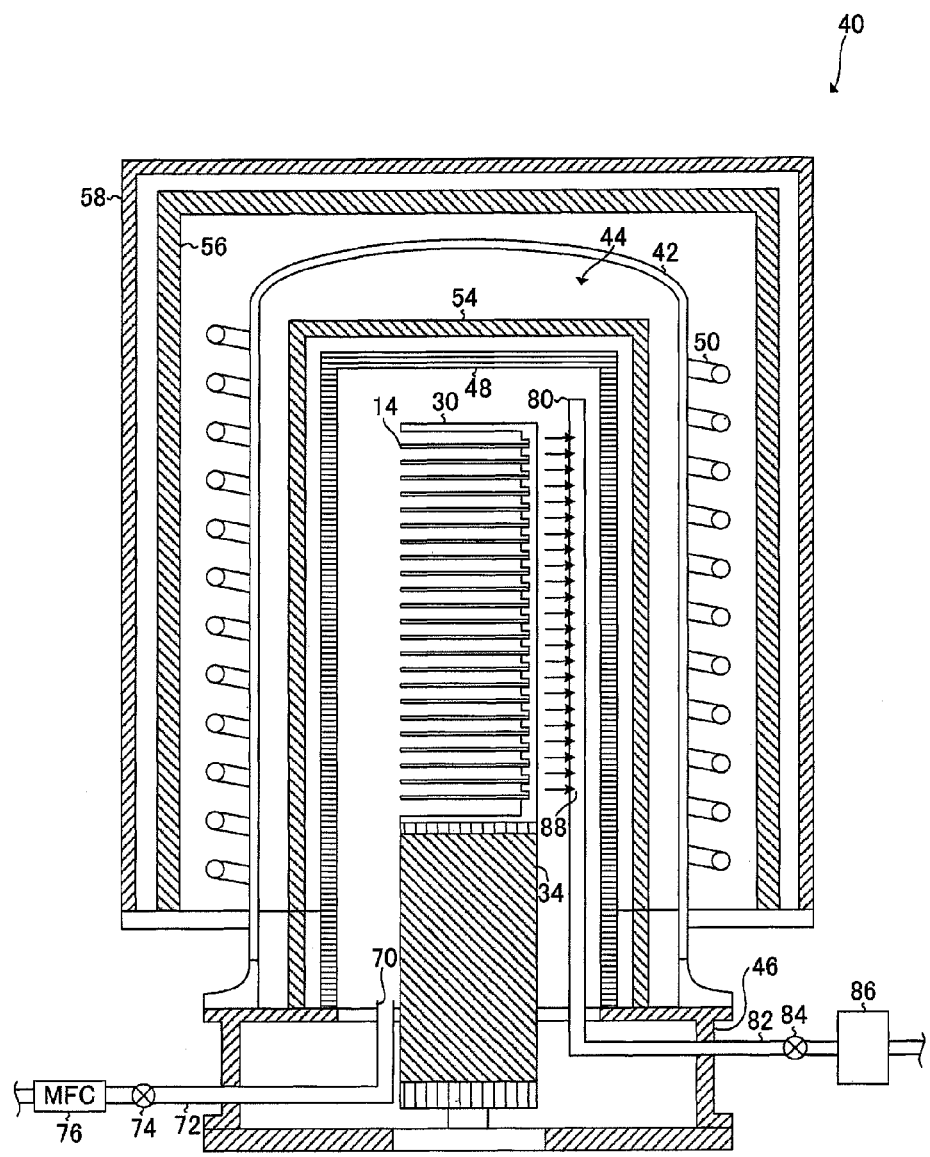
FIG. 6 is a side sectional view illustrating a process furnace used in a second embodiment of the present invention.

Next, a second embodiment will be described. FIG. 6 is a schematic view illustrating a process furnace 40 used in the second embodiment. In the current embodiment, a gas supply inlet 70 is disposed at a gas supply side, and a gas supply nozzle 80 including exhaust holes 88 is disposed at a gas exhaust side.

Third Embodiment

Figure 7:
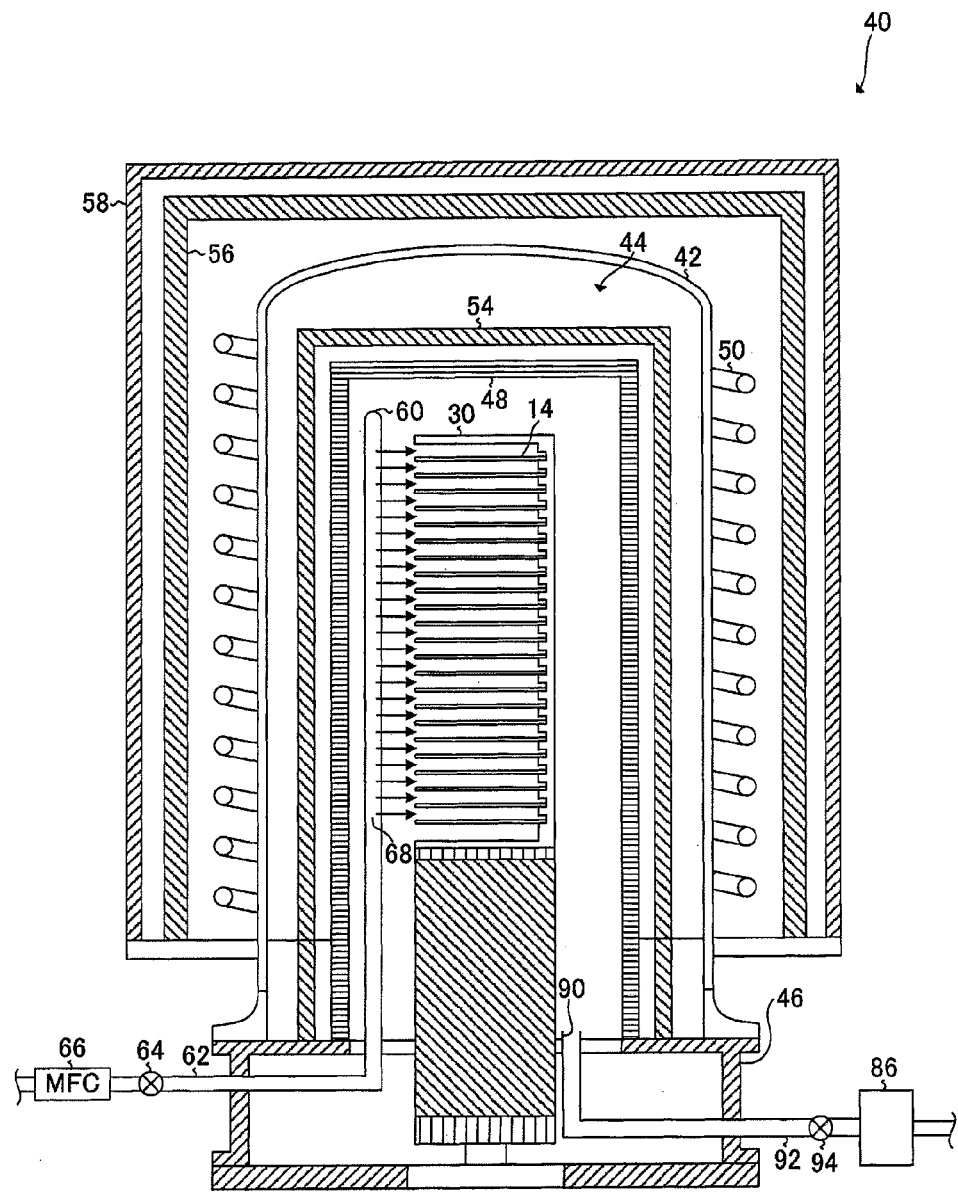
FIG. 7 is a side sectional view illustrating a process furnace used in a third embodiment of the present invention.

Next, a third embodiment will be described. FIG. 7 is a schematic view illustrating a process furnace 40 used in the third embodiment. In the current embodiment, a gas supply nozzle 60 including supply holes 68 is disposed at a gas supply side, and a gas exhaust outlet 90 is disposed at a gas exhaust side.

The present invention is not limited to the above-described embodiments. For example, the number, arrangement or combination of gas supply nozzles 60, gas supply inlets 70, gas exhaust nozzle 80, and gas exhaust outlets 90 may be properly changed according to purposes.

Fourth Embodiment

Figure 8:
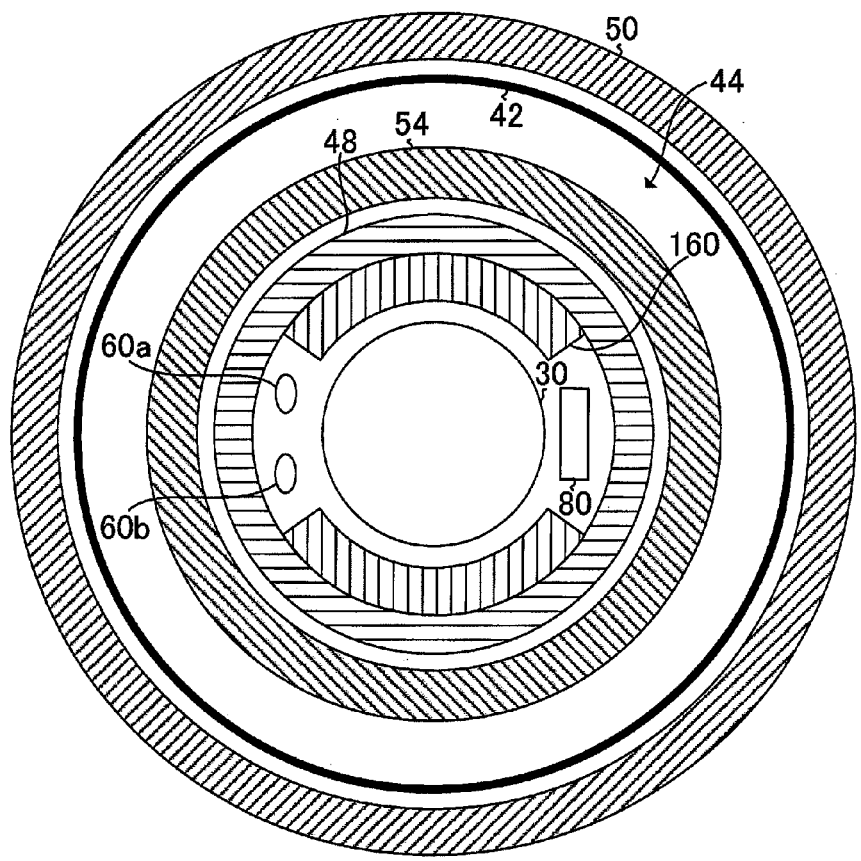
FIG. 8 is a cross-sectional view illustrating a process furnace used in a fourth embodiment of the present invention.

Next, a fourth embodiment will be described. FIG. 8 is a sectional view illustrating a process furnace 40 used in the fourth embodiment. According to the current embodiment, in the periphery of a space in which a boat 30 is loaded, susceptor walls 160 are installed in regions where gas supply nozzles 60a and 60b and a gas exhaust nozzle 80 are not disposed. Therefore, reaction gases ejected from the gas supply nozzles 60a and 60b can be efficiently supplied to wafers 14 held in the boat 30.

In this way, the susceptor walls 160 disposed at positions where the gas supply nozzles 60a and 60b and the gas exhaust nozzle 80 are not installed are closer to the boat 30 than parts of a susceptor 48 located at positions where the susceptor walls 160 are installed.

The susceptor walls 160 are installed to narrow a space between the boat 30 and the susceptor 48 within a predetermined range where loading and unloading of the boat 30 are not hindered and supply of a reaction gas to the wafers 14 held in the boat 30 is not hindered.

The susceptor walls 160 may be made of a heat-resistant conductive material (for example, durable to a temperature of up to 1700° C.), such as carbon coated with SiC or TaC (tantalum carbide), high-purity SiC, or a metal having a high melting point (e.g., tungsten (W), tantalum (Ta), or molybdenum (Mo)).

As described above, the present invention provides a heat treatment apparatus capable of forming films having a uniform thickness on a plurality of substrates.

(Supplementary Note) The present invention also includes the following embodiments.

(Supplementary Note 1)

According to an embodiment of the present invention, there is provided a heat treatment apparatus including: a process chamber configured to grow silicon carbide (SiC) epitaxial films on SiC substrates; a substrate holding tool configured to hold a plurality of substrates in a state where the substrates are vertically arranged and approximately horizontally oriented, so as to hold the substrates in the process chamber; a heating unit installed in the process chamber; a reaction gas supply system installed at an inner side of the heating unit and configured to supply a reaction gas, wherein the heating unit comprises: a heating part configured to cover at least a part of the substrate holding tool; and a rectifying part disposed between the substrate holding tool and the heating unit.

(Supplementary Note 2)

The heat treatment apparatus of Supplementary Note 1 may further comprise a magnetic field generating unit installed outside the process chamber for electromagnetic induction heating.

(Supplementary Note 3)

In the heat treatment apparatus of Supplementary Note 1, the reaction gas supply system may comprise: at least one first supply unit configured to supply a silicon-containing gas as a silicon source; and at least one second supply unit configured to supply a carbon-containing gas as a carbon source.

(Supplementary Note 4)

The heat treatment apparatus of Supplementary Note 1 may further comprise an insulating material installed between the heating unit and an outer tube constituting the process chamber.

(Supplementary Note 5)

The heat treatment apparatus of Supplementary Note 1 may further comprise a dopant gas supply system configured to supply a dopant gas as a doping source.

What is claimed is:

1. A heat treatment apparatus comprising:
    a reaction vessel forming a process chamber configured to grow silicon carbide (SiC) epitaxial films on a plurality of SiC substrates;
    a susceptor installed in the process chamber, the susceptor being heated by electromagnetic induction heating which is in response to a magnetic field, wherein the susceptor is made from graphite;
    a magnetic field generating unit installed outside the reaction vessel and configured to generate the magnetic field to heat the susceptor by electromagnetic induction heating;
    a substrate holding tool configured to hold the plurality of SiC substrates in a state where the plurality of SiC substrates are vertically arranged and approximately horizontally oriented so as to hold the plurality of SiC substrates in the process chamber;
    an inner insulating wall installed between the reaction vessel and the susceptor, wherein the inner insulating wall has a cylinder shape and an upper end of the inner insulating wall is closed;
    a gas supply system installed at an inner side of the susceptor and configured to supply a reaction gas;
    a gas exhaust outlet configured to exhaust the reaction gas supplied by the gas supply system; and
    susceptor walls comprising at least one of: carbon coated with SiC or TaC, high-purity SiC, tungsten (W), tantalum (Ta), and molybdenum (Mo) installed in a region between the susceptor and the substrate holding tool other than where the gas supply nozzle and the gas exhaust outlet are disposed,
    and
    wherein the susceptor walls comprise a first wall having an arc-shaped cross-section and a second wall having an arc-shaped cross-section and disposed at a location spaced apart from the first wall and the susceptor has a continuous cylinder-shape with circular cross-section.

2. The treatment apparatus of claim 1, wherein the gas supply system comprises:
    at least one first supply nozzle configured to supply a silicon-containing gas as a silicon source; and
    at least one second supply nozzle configured to supply a carbon-containing gas as a carbon source.

3. The heat treatment apparatus of claim 1, further comprising:
a dopant gas supply system configured to supply a dopant gas as a doping source.

4. The heat treatment apparatus of claim 1, wherein the susceptor walls are installed closer to the substrate holding tool than a portion of the susceptor located where the gas supply system and the gas exhaust outlet are disposed.

5. The heat treatment apparatus of claim 1, wherein the susceptor walls are configured in a manner that the reaction gas supplied by the gas supply system is provided to the plurality of SiC substrates supported by the substrate holding tool.

6. The heat treatment apparatus of claim 1, wherein the susceptor walls are disposed interior to the susceptor in a manner that a distance between the susceptor walls and the substrate holding tool is smaller than a distance between the susceptor and the substrate holding tool.

7. A substrate processing apparatus comprising:
a reaction vessel forming a process chamber configured to process a plurality of substrates;
a susceptor disposed in the reaction vessel to cover at least a part of the substrate holding tool, the susceptor being heated by electromagnetic induction heating which is in response to a magnetic field, wherein susceptor is made of graphite;
a magnetic field generating unit installed outside the reaction vessel and configured to generate the magnetic field to heat the susceptor by electromagnetic induction heating;
a substrate holding tool configured to hold the plurality of substrates in a state where the plurality of substrates are vertically arranged and approximately horizontally oriented so as to hold the plurality of substrates in the process chamber;
a gas supply system installed inside the process chamber and configured to supply a reaction gas;
a gas exhaust outlet configured to exhaust the reaction gas supplied by the gas supply system;
an inner insulating wall installed between the reaction vessel and the susceptor, wherein the inner insulating wall has a cylinder shape and an upper end of the inner insulating wall is closed; and
susceptor walls comprising at least one of: carbon coated with SiC or TaC, high-purity SiC, tungsten (W), tantalum (Ta), and molybdenum (Mo) installed in a region between the susceptor and the substrate holding tool other than where the gas supply system and the gas exhaust outlet are disposed,
and
wherein the susceptor walls comprise a first wall having an arc-shaped cross-section and a second wall having an arc-shaped cross-section and disposed at a location spaced apart from the first wall and the heating unit has a continuous cylinder-shape with circular cross-section.

8. The substrate processing apparatus of claim 7, wherein the reaction gas supply system comprises:
at least one first supply unit configured to supply a silicon-containing gas as a silicon source; and
at least one second supply unit configured to supply a carbon-containing gas as a carbon source.

9. The substrate processing apparatus of claim 7, further comprising:
a dopant gas supply system configured to supply a dopant gas as a doping source.

10. The substrate processing apparatus of claim 7, wherein the susceptor walls are installed closer to the substrate holding tool than a portion of the susceptor located where the gas supply system and the gas exhaust outlet are disposed.

11. The substrate processing apparatus of claim 7, wherein the susceptor walls are configured in a manner that the reaction gas supplied by the gas supply system is provided to the plurality of SiC substrates supported by the substrate holding tool.

12. The substrate processing apparatus of claim 7, wherein the susceptor walls are disposed interior to the susceptor in a manner that a distance between the susceptor walls and the substrate holding tool is smaller than a distance between the susceptor and the substrate holding tool.

* * * * *